United States Patent
Boccia et al.

(10) Patent No.: US 7,183,636 B1
(45) Date of Patent: Feb. 27, 2007

(54) ADAPTER FOR A CHIP CARD HAVING A REDUCED FORMAT IN COMPARISON WITH THE STANDARD SIM MINI-CARD FORMAT

(75) Inventors: Henri Boccia, Belcodene (FR); Olivier Brunet, Marseilles (FR); Philippe Patrice, Marseilles (FR); Isabelle Limousin, Aix en Provence (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/979,891

(22) PCT Filed: May 11, 2000

(86) PCT No.: PCT/FR00/01272

§ 371 (c)(1),
(2), (4) Date: Nov. 27, 2001

(87) PCT Pub. No.: WO00/73989

PCT Pub. Date: Dec. 7, 2000

(30) Foreign Application Priority Data

May 27, 1999 (FR) .................................. 99 06729

(51) Int. Cl.
*H01L 23/02* (2006.01)

(52) U.S. Cl. ...................... 257/679; 257/678; 361/737; 361/731; 361/732; 361/801

(58) Field of Classification Search ................ 361/760, 361/761, 736, 737, 764, 740, 741, 747, 759, 361/801–802, 814, 752, 796, 727–728; 257/679, 257/678, 680
See application file for complete search history.

(56) References Cited

U.S. PATENT DOCUMENTS

| 4,727,246 | A | * | 2/1988 | Hara et al. ................... 235/488 |
| 4,897,534 | A | * | 1/1990 | Haghiri-Tehrani .......... 235/488 |
| 4,980,802 | A | * | 12/1990 | Champagne et al. ....... 361/764 |
| 5,205,032 | A | * | 4/1993 | Kuroda et al. ................ 29/740 |
| 5,677,524 | A | | 10/1997 | Haghiri-Tehrani |
| 5,831,256 | A | * | 11/1998 | De Larminat et al. ...... 235/486 |
| 5,933,328 | A | * | 8/1999 | Wallace et al. ............. 361/737 |

(Continued)

FOREIGN PATENT DOCUMENTS

DE 4218923 10/1992

(Continued)

*Primary Examiner*—Zandra V. Smith
*Assistant Examiner*—Thanh Y. Tran
(74) *Attorney, Agent, or Firm*—Buchanan Ingersoll & Rooney PC

(57) ABSTRACT

An adapter for a portable integrated circuit device of the chip card variety has a reduced format in comparison with the standard mini-card format. The device with a reduced format includes a body on which a microcircuit defining contact pads is disposed. A support which has a standard mini-card format is provided with a cavity having the dimensions of the device with a reduced format. The device is detachably fixed in the cavity. The cavity is located in the support in such a way that the location of the contact pads of the microcircuit of the device with a reduced format coincides with the standardization location of the contact pads of a microcircuit having a standard format mini-card.

20 Claims, 3 Drawing Sheets

U.S. PATENT DOCUMENTS

| | | | |
|---|---|---|---|
| 6,009,315 A * | 12/1999 | De Larminat et al. | 455/558 |
| 6,065,681 A * | 5/2000 | Trueggelmann | 235/487 |
| 6,213,403 B1 * | 4/2001 | Bates, III | 235/492 |
| 6,239,976 B1 * | 5/2001 | Templeton et al. | 361/737 |
| 6,240,301 B1 * | 5/2001 | Phillips | 455/558 |
| 6,292,561 B1 * | 9/2001 | Benson | 379/433.13 |
| 6,320,751 B2 * | 11/2001 | Takeda et al. | 361/737 |
| 6,398,114 B1 * | 6/2002 | Nishikawa et al. | 235/492 |
| 6,448,638 B1 * | 9/2002 | Fidalgo et al. | 257/679 |
| 6,527,489 B2 * | 3/2003 | Kando | 411/107 |
| 2002/0076954 A1 * | 6/2002 | Chen et al. | 439/76.1 |

FOREIGN PATENT DOCUMENTS

| | | |
|---|---|---|
| DE | 29503249 | 12/1995 |
| DE | 19703122 | 5/1998 |
| EP | 0328124 B1 | 8/1989 |
| EP | 0521778 | 1/1993 |
| EP | 0 638 873 | 2/1995 |
| EP | 0 869 452 | 10/1998 |
| FR | 2718549 | 10/1995 |
| WO | WO 00/43950 | 7/2000 |
| WO | WO 00/49567 | 8/2000 |

* cited by examiner

ADAPTER FOR A CHIP CARD HAVING A REDUCED FORMAT IN COMPARISON WITH THE STANDARD SIM MINI-CARD FORMAT

This disclosure is based upon French Application No. 99/06729, filed on May 27, 1999 and International Application No. PCT/FR00/01272, filed May 11, 2000, which was published on Dec. 7, 2000 in a language other than English, the contents of which are incorporated herein by reference.

BACKGROUND OF THE INVENTION

The present invention concerns an adaptor for a portable electronic device, of the smart card type, with a format smaller than the current standard format and more particularly smaller than the current standard minicard format.

The invention also relates to the method of manufacturing the adaptor according to the present invention.

There exist principally two standard formats of smart card on the market. Firstly the smart cards complying with the ISO standard, essentially intended for communication, identification or electronic cash operations for example, and on the other hand smart cards complying with the so-called mini SIM card standard, essentially intended to be inserted in a mobile telephone to the GSM (Global System for Mobile communications) standard for example.

The present invention concerns more particularly the field of minicards for a mobile telephony application.

A minicard to the current standard format is illustrated schematically, seen from above, in FIG. 1.

Such a minicard constitutes a smart card with contact having a support 100, produced by plastic moulding or injection, and a microcircuit 10' attached to the said support 100 with metallisation areas 11' flush with the surface of the support 100 so as to allow an electrical connection of the chip of the microcircuit 10' with an operating circuit, for example the electronic circuit of the mobile telephone.

These current minicards comply with an established international standard which fixes their dimensions in order to allow their use with any mobile telephone complying with the same standard. In particular, the minicards have a rectangular-shaped card body 100, 15 mm by 25 mm, with a thickness of 760 µm, and has a locating cut 105, 3 mm by 3 mm, on the bottom right hand corner of the card support 100.

The microcircuit 10' is situated at a precise location on the support 100 of the minicard to allow standard electrical connection with the connectors of the telephones to the standard.

Preferentially, the microcircuit 10' has been placed in a cavity previously provided in the minicard support 100. The cavity can be produced by machining or at the time of plastic injection in the card mould, for example, or by any other well-known technique.

Likewise, the insetting, or attaching, of the microcircuit 10' in this cavity is produced by hot pressing or by gluing for example, or by any other means, according to techniques also well known to experts.

Thus the microcircuit 10' is situated at a precise location on the support 100 defined by the mini SIM standard, which fixes this location on the corner opposite to the locating cut, that is to say the top left-hand corner, at 1.5 mm from the top edge and 4 mm from the left-hand edge.

SUMMARY OF THE INVENTION

The present invention relates to an adaptor for adapting a portable electronic device, of the smart card, to a new format, to a card to a standard format, ISO or mini SIM, the format of this device being smaller than the standard mini SIM format.

This is because, in the context of a standardisation of third-generation mobile telephones to the GSM standard, a new minicard format is proposed. These new minicards to a new format are referred to hereinafter as PLUG 3G.

Nevertheless it is advantageous to enable the old mobile telephones still on the market to function with cards from the new generation.

Thus the present invention proposes an adaptor which allows the use of a PLUG 3G card with an appliance whose reader is intended to receive an ISO or mini SIM card from the previous generation.

To this end, the present invention proposes to produce a support to the standard format of a mini SIM card provided with a cavity able to receive the device to the smaller format.

According to a preferential embodiment, the present invention proposes to produce a universal adaptor by producing a support to the standard format of an ISO card having a precut which delimits a portion of the support to the standard format of a minicard, this portion being provided with the cavity able to receive the device to the smaller format.

The present invention relates more particularly to an adaptor for a portable integrated-circuit electronic device, of the smart card type, to a smaller format compared with the standard format of a minicard, the device to the smaller format comprising a body on which a microcircuit is disposed, defining contact areas, characterised in that it comprises a support to the standard format of a minicard, provided with a cavity to the dimensions of the device to the smaller format, and means for the removable fixing of the said device in the cavity, and in that the cavity is situated in the support so that the location of the contact areas of the microcircuit of the device to the smaller format coincides with the standard location of the contact areas of a microcircuit of a minicard to the standard format.

According to an essential characteristic of the invention, the support to the standard format of a minicard defines an internal portion of a support to the standard format of an ISO card, the said internal portion being delimited in the ISO support by a precut.

According to one embodiment, the cavity has a bottom.

According to a variant, the cavity has at least one concave wall.

According to another variant, the support has semi-perforated cuts produced on each side of the cavity.

According to another embodiment, the body of the device to the smaller format has an asymmetric shape, the cavity being pierced throughout the thickness of the support, and having an asymmetric shape complementary to the shape of the body of the device to the smaller format.

The present invention also concerns a method of manufacturing an adaptor for a portable integrated-circuit electronic device, of the smart card type, to a smaller format compared with the standard format of a minicard, the device to the smaller format comprising a body on which there is disposed a microcircuit defining contact areas, the said device being intended to be inserted in a mobile telephone, characterised in that it comprises the following steps:

producing a support to the standard format of a smart card;

producing a cavity to the dimensions of the card to the smaller format, the said cavity being situated in the support so that the location of the contact areas of the microcircuit of the device to the smaller format coincides with the standard location of the contact areas of a microcircuit of a card to the standard format;

fixing the device to the smaller format in the cavity of the support.

According to a first embodiment, the support is produced to the standard format of a minicard.

According to a second embodiment, the support is produced to the standard format of an ISO card.

According to one characteristic of this second embodiment, a precut is effected in the support to the standard format of an ISO card, the precut delimiting an internal portion to the standard format of a minicard.

According to a preferential embodiment, the support is obtained by moulding, the precut being effected at the time of moulding.

According to one characteristic, the precut is effected in the form of a discontinuous slot interrupted by tabs.

According to a first embodiment, the fixing of the device to the smaller format in the cavity of the support is effected by gluing, the cavity having a bottom on which the said device is glued.

According to a second embodiment, the cavity of the support has a bottom and at least one concave wall so as to provide the fixing of the device to the smaller format by gripping between the bottom and the concave wall of the cavity.

According to a third embodiment, the device to the smaller format has an asymmetric shape, the cavity having an asymmetric shape complementary to that of the device, the latter being fixed in the cavity by gripping of the complementary asymmetric shapes.

According to a fourth embodiment, the support has semi-perforated cuts in wave form on each side of the cavity each exerting a pressure force on the walls of the cavity directed towards the inside of the latter, the device to the smaller format being held in the cavity by gripping between the walls and the bottom of the cavity.

The present invention makes it possible to obtain, with a simple method, a universal adaptor allowing the direct use of a PLUG 3G card on appliances intended to receive current mini SIM or ISO cards.

Thus the change in the standard will not close the market of new cards to old appliances, such as mobile telephones for example.

BRIEF DESCRIPTION OF THE DRAWINGS

Other particularities and advantages of the invention will emerge from a reading of the following description given by way of illustrative and non-limitative example made with reference to the accompanying figures, for which.

DESCRIPTION OF THE INVENTION

Figure 1:
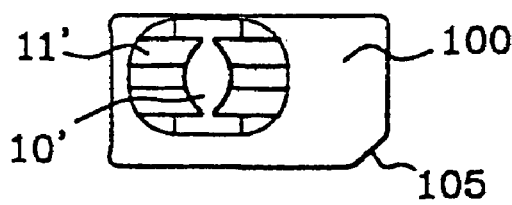
FIG. 1, already described, is a schematic plan view of a mini SIM card to the current standard format of minicards.
Figure 2:
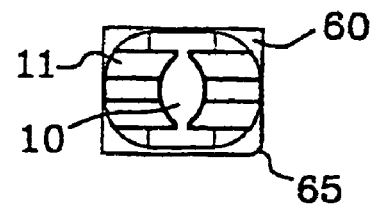
FIG. 2 is a schematic plan view of a portable electronic device to a smaller format compared with the standard format.

Referring to FIG. 2, the device to the smaller format compared with the standard format of a minicard has a rectangular-shaped card body 60 whose dimensions are smaller than the dimensions of the known formats. This device is referred to below as PLUG 3G.

For example, the card body 60 has a length of 15 mm and a width of 10 mm with a thickness less than or equal to 760 μm and has a locating cut 65 of 1 mm by 1 mm on the bottom right-hand corner of the card.

As on the minicards to the standard mini SIM format, a microcircuit 10 is integrated into a cavity provided in the body 60 of the PLUG 3G card, this microcircuit 10 covering almost all the surface of the PLUG 3G card. More precisely, it is situated at approximately 0.5 mm from the edge of each side of the card.

The microcircuit 10 also has metallisation areas 11 which define the contact areas of the chip of the microcircuit 10. These contact areas 11 are intended to establish electrical contact between the chip of the microcircuit 10 and an operating circuit.

The operating circuit, integrated into the mobile telephone for example, is designed to read the data carried by the card and to use them. It is provided with a connector in which the user inserts the card. This connector comprises a series of contact blades intended to come into abutment on the contact areas 11 of the microcircuit 10 of the card when the latter is correctly inserted in the connector. It is consequently essential, so that the electrical connection is properly established, for the standard to precisely define the position of the microcircuit 10, and of its contact areas 11, with respect to the edges of the card support.

In order to allow the use of this PLUG 3G minicard to the new format with a telephone whose connector is designed to read a card to the current standard format, mini SIM or ISO, it is necessary to place this PLUG 3G minicard on an adaptor which will make it possible to effect a match between the contact areas 11 of the microcircuit 10 and the contact blades of the connector.

Figure 3:
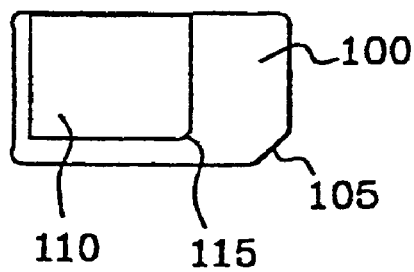
FIG. 3 is a plan view of the adaptor according to the invention to the format of a minicard.
Figure 4:
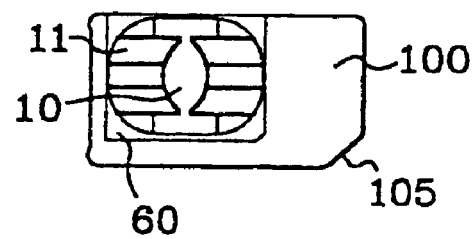
FIG. 4 is a view of FIG. 3 with fitting of the device to the smaller format.

A first variant of such an adaptor is illustrated schematically, seen from above, on FIGS. 3 and 4, FIG. 3 presenting the adaptor and FIG. 4 the fitting of the PLUG 3G minicard in the adaptor.

The adaptor according to the invention comprises a support 100 to the dimensions of a card body to the standard format of a minicard, that is to say a support 100 of 25 mm by 15 mm, with a locating cut 105 of 3 mm by 3 mm on the bottom right-hand corner. This support 100 can be produced according to conventional techniques, by moulding for example.

A cavity 110 is then provided in the support 100, this cavity 110 having dimensions corresponding to those of the electronic device to be adapted, that is to say to the dimensions of the PLUG 3G minicard, that is to say 15 mm by 10 mm, with a locating cut 115 of 1 mm by 1 mm on the bottom right-hand corner.

The cavity 100 can be produced by moulding or by injection during the production of the support 200, or by machining. These techniques are well known to the manufacturers of smart cards.

The PLUG 3G minicard can then be transferred into this cavity 110 and held by fixing means such as gluing, or gripping for example. The different means of fixing the PLUG 3G minicard in the cavity 110 will be described subsequently with reference to the different embodiments.

Preferentially, the means of fixing the PLUG 3G minicard are removable to allow the direct use of the device to the smaller format without an adaptor.

The cavity 110 accepting the PLUG 3G minicard is situated in the support 100 so as to comply with the constraint, disclosed above, of the positioning of the contact areas 11 of the microcircuit 10 of the minicard vis-à-vis the contact blades of the connector, so that electrical contact can be established between the microcircuit 10 of the PLUG 3G minicard and the operating circuit of an appliance such as a telephone for example.

A second variant of the present invention consists of producing a universal adaptor which makes it possible to use the device to the smaller format on a support to the format of an ISO card, and/or on a card to the mini SIM format.

Figure 5:
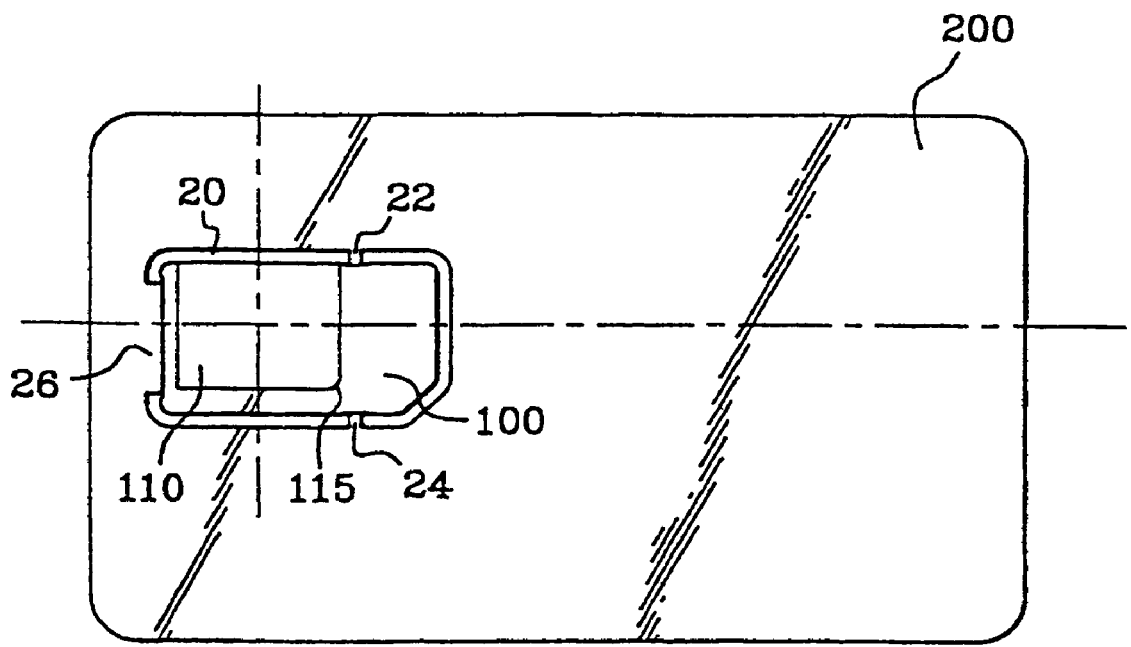
FIG. 5 is a plan view of the principle of the universal adaptor according to the present invention.
Figure 6:
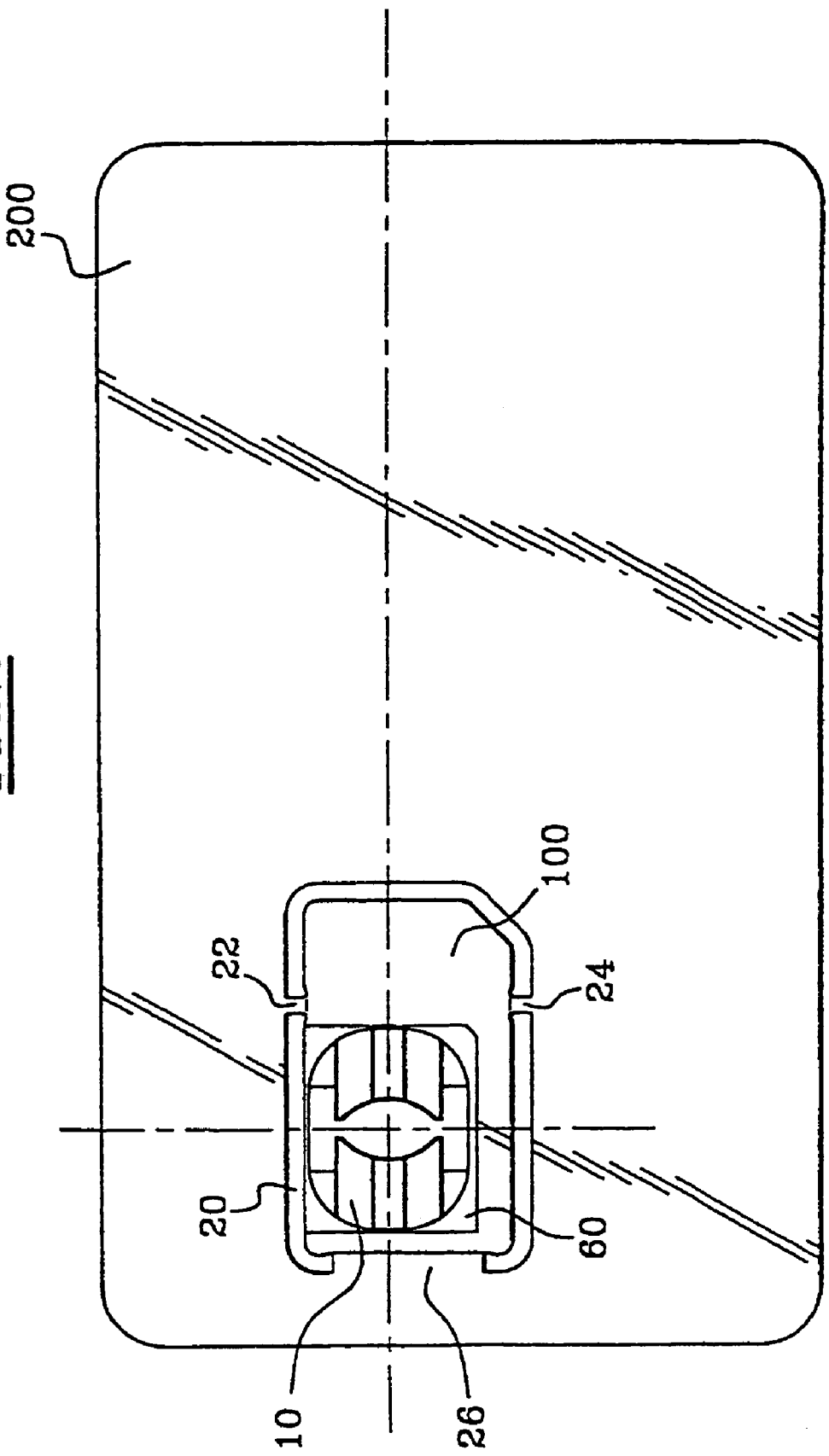
FIG. 6 is a plan view of the principle of the universal adaptor with fitting of the device to the smaller format.

Such a universal adaptor is illustrated, seen from above in FIGS. 5 and 6.

The universal adaptor according to the invention comprises a support 200 to the dimensions of a card body to the standard format of an ISO card, that is to say a support measuring 85 mm by 54 mm. This support 200 can be produced according to conventional techniques, by moulding for example.

A precut 20 is effected around a portion 100 internal to the support 200. This internal portion 100 has the dimensions of a card body to the standard format of a minicard, that is to say a portion 100 measuring 25 mm by 15 mm, with a locating cut 105 of 3 mm by 3 mm on the bottom right-hand corner.

This precut 20 is provided so as to allow easy separation of the internal portion 100 from the support 200 in order to obtain a support to the mini SIM format. It can advantageously be effected by moulding at the same time as the support 200.

According to a preferential embodiment, the precut is in the form of a discontinuous slot 20 interrupted so as to create tabs 22, 24, 26 which enable the internal portion 100 to remain integral with the support 200. A support to the mini SIM format can thus be obtained by causing the breakage of the said tabs simply by pressing on the internal portion 100.

In this embodiment, the cavity 110 is provided in the internal portion 100 of the support 200 according to the conventional techniques mentioned above.

The PLUG 3G minicard can then be transferred into this cavity 110 and held by fixing means.

The cavity 110 accepting the PLUG 3G minicard is situated in the support 200 so as to comply with the constraint, disclosed previously, of the positioning of the contact areas 11 of the microcircuit 10 of the minicard vis-à-vis the contact blades of the connector.

In this way a universal adaptor is obtained which allows the use of the PLUG 3G card either directly in a reader able to receive a card to the ISO format or indirectly in a reader able to receive a card to the mini SIM format after breakage of the tabs 22, 24, 26 retaining the support portion 100.

FIGS. 7 to 10 illustrate several embodiments of the adaptor according to the invention, and more particularly several embodiments of the cavity and of the fixing of the device to the smaller format in this cavity.

A first embodiment, not illustrated, consists of producing a cavity 110 by moulding or machining, with a bottom, and then fitting the PLUG 3G minicard in the cavity 110 in the support 100 by gluing with a glue or any cold adhesive which is disposed in the bottom of the cavity 110.

Figure 7:
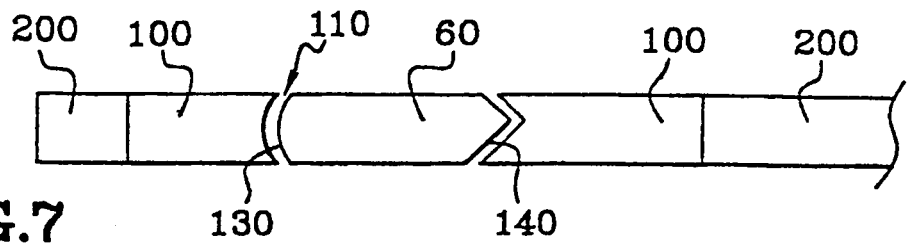
FIG. 7 is a view in section of a second embodiment of the adaptor according to the present invention.

Referring to FIG. 7, a second embodiment is illustrated in section. According to this embodiment, the cavity 110 is pierced throughout the thickness of the support 100 without a bottom. Such a cavity 110 can be machined and/or injected according to known techniques.

The cavity 110 has a given asymmetric shape which is complementary to the shape given to the body 60 of the PLUG 3G minicard. In the example illustrated in FIG. 5, the asymmetric shape consists of a concave wall 130 opposite a wall in the form of an asymmetric point 140.

Such complementary asymmetry in the shapes of the minicard body 60 and the cavity 110 of the support 100 make it possible to obtain the holding of the minicard in the cavity 110 in the support 100 by gripping the card body 60 between the walls of the cavity 110.

The asymmetric shapes are obtained by injection and/or cutting, for example, or by any other suitable technique.

Figure 8:
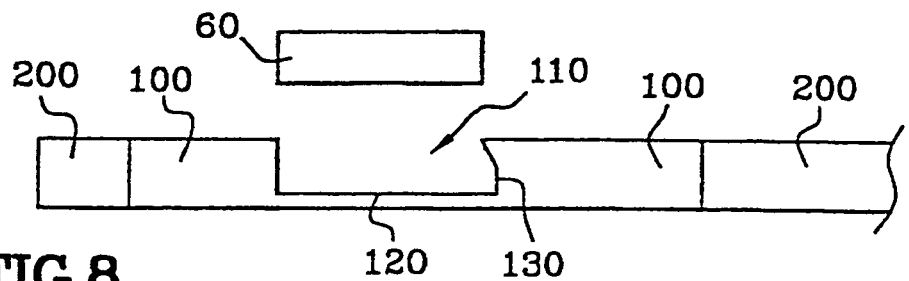
FIG. 8 is a view in section of a first variant of a third embodiment of the adaptor according to the invention.
Figure 9:
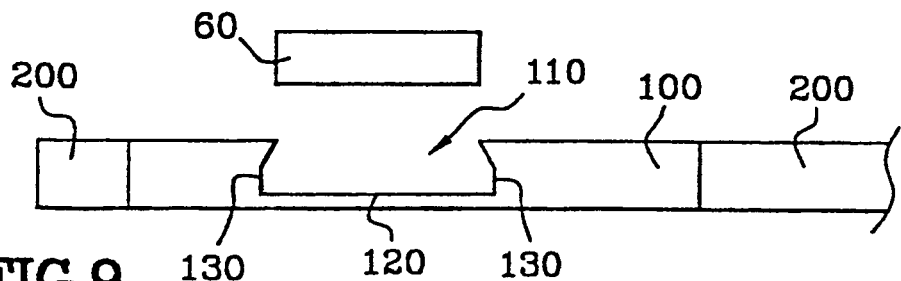
FIG. 9 is a view in section of a second variant of the third embodiment of the adaptor according to the invention.

FIGS. 8 and 9 illustrate, with views in section, two variants of a third embodiment.

According to this embodiment, the cavity 110 of the support 100 has a bottom 120, and at least one wall of the cavity 110 is concave. This concave wall 130 enables the minicard to be held in the cavity 110 of the support 100 by gripping the card body 60 between the bottom 120 and the concave wall 130.

According to the variant embodiments, the cavity 110 is obtained by moulding and has a single concave wall 130, as illustrated in FIG. 5; or by machining, and can have at least two concave walls 130, as illustrated in FIG. 6.

Figure 10:
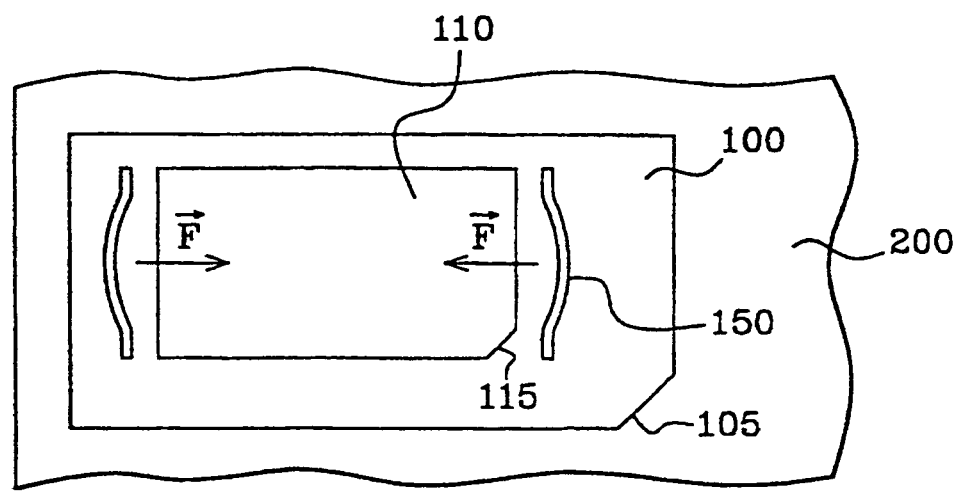
FIG. 10 is a plan view of a fourth embodiment of the adaptor according to the invention.

FIG. 10 illustrates a fourth embodiment of the adaptor according to the invention.

According to this embodiment, a cavity 110, provided with a bottom 120, is produced by any means, and semi-perforated cuts 150 are produced, in the support 100, on each side of the cavity 110.

These cuts 150 advantageously have wave shapes so as to introduce a clearance in the material of the support 100 and to constitute dampers.

These cuts 150 are designed each to exert a force F towards the inside of the cavity 110 and thus to enable the minicard to be held in the cavity 110 in the support 100 by pressing the card between the bottom 120 of the cavity 110 and the walls subjected to the pressure forces F.

The invention claimed is:

1. An adaptor for a portable electronic card comprising a module, containing a microcircuit and a set of contacts, fixed within a body having a size smaller than a SIM card having dimensions of 25 mm×15 mm, said portable electronic card being directly insertable in a telecommunications device, said adaptor comprising a support having the format of an integrated-circuit card with dimensions of 25 mm×15 mm or 85 mm×54 mm and including a cavity with a shape complementary to that of said body and located on said support at a position so that, when a portable electronic card is disposed in said cavity, said contacts are located at a position that conforms to at least one integrated-circuit card standard, and means for removably retaining a portable electronic card in said cavity.

2. An adaptor according to claim 1, wherein the support has the format of a SIM card with dimensions of 25 mm×15 mm and defines an internal portion of a larger support having the format of an ISO card with dimensions of 85 mm×54 mm, said internal portion being delimited in the larger support by a precut.

3. An adaptor according to claim 1 wherein the cavity has a bottom.

4. An adaptor according to claim 1 wherein said retaining means comprises at least one concave wall in said cavity.

5. An adaptor according to claim 1 wherein said retaining means comprises semi-perforated cuts in said support on opposed sides of the cavity.

6. An adaptor according to claim 1, wherein said body has an asymmetric shape, and the cavity extends throughout the thickness of the support, and has an asymmetric shape complementary to that of the body.

7. An adaptor according to claim 1, wherein said body has a format that conforms to at least one standard for SIM cards.

8. An adaptor according to claim 1, wherein said format comprises a generally rectangular shape with a locator notch at one corner thereof.

9. A support for a portable electronic card comprising a module, containing a microcircuit and a set of contacts, embedded within a body having a size smaller than a SIM card having dimensions of 25 mm×15 mm, said portable electronic card being directly insertable in a telecommunications device, said support having a format that conforms to one of a SIM card with dimensions of 25 mm×15 mm or an ISO card with dimensions of 85 mm×54 mm, and a cavity for receiving said body with a shape substantially complementary to that of the body, and means for removably fixing the body in the cavity, so that the location of the contacts on the module coincide with the location of the contact areas defined by at least one standard for SIM cards.

10. A support according to claim 9, wherein the support has the format of a SIM card with dimensions of 25 mm×15 mm.

11. A support according to claim 9, wherein the support has the format of an ISO card with dimensions of 85 mm×54 mm.

12. A support according to claim 11 wherein the support has at least one precut to delimit an internal portion that conforms to the format of a SIM card with dimensions of 25 mm×15 mm.

13. A support according to claim 12 wherein said precut comprises a discontinuous slot interrupted by tabs.

14. A support according to claim 9 wherein the means for removably fixing comprises at least one concave wall in said cavity that grips the body between the concave wall and an opposing wall of the cavity.

15. A support according to claim 9 wherein the body has an asymmetric shape, the cavity has an asymmetric shape complementary to that of the body, and the body is fixed in the cavity by gripping the body within the cavity.

16. A support according to claim 9 wherein the support has semi-perforated cuts on each side of the cavity and each exerting a force on a corresponding wall of the cavity, said force being directed towards the inside of said cavity, the body being held in said cavity by gripping between the corresponding walls of the cavity.

17. An adaptor according to claim 9, wherein said body has a format that conforms to at least one standard for SIM cards.

18. An adaptor according to claim 9, wherein said format comprises a generally rectangular shape with a locator notch at one corner thereof.

19. A method of manufacturing a support for a portable integrated-circuit electronic minicard that is intended to be inserted in a mobile telephone, comprising the following steps:

producing a support that conforms to the format of a SIM card having dimensions of 25 mm×15 mm;

forming a cavity in said support that has the dimensions of a body for a portable integrated-circuit electronic minicard having a format smaller than said SIM card and that is directly insertable in a mobile telephone; and removably fixing the portable integrated-circuit electronic minicard in the cavity of the support.

20. A manufacturing method according to claim 19, wherein the cavity in the support has at least one concave wall, and the step of removably fixing the minicard is effected by gripping the body of the minicard between the concave wall and another wall of the cavity.

* * * * *